United States Patent
Nee et al.

(10) Patent No.: US 10,057,088 B2
(45) Date of Patent: Aug. 21, 2018

(54) TERMINAL CIRCUIT AND OUTPUT STAGE CIRCUIT HAVING THE SAME

(71) Applicant: ALi Corporation, Hsinchu (TW)

(72) Inventors: Hsu-Che Nee, Hsinchu (TW); Yi-Hsien Cheng, Hsinchu (TW)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 15/688,941

(22) Filed: Aug. 29, 2017

(65) Prior Publication Data
US 2018/0083804 A1   Mar. 22, 2018

(30) Foreign Application Priority Data
Sep. 18, 2016   (CN) .......................... 2016 1 0827204

(51) Int. Cl.
| H04L 25/02 | (2006.01) |
| H03K 19/0175 | (2006.01) |
| H03K 19/003 | (2006.01) |

(52) U.S. Cl.
CPC ... *H04L 25/0272* (2013.01); *H03K 19/00315* (2013.01); *H03K 19/017545* (2013.01); *H04L 25/028* (2013.01); *H04L 25/0278* (2013.01); *G09G 2370/12* (2013.01)

(58) Field of Classification Search
CPC ............ G06F 13/4086; G06F 13/4022; G06F 13/4282; H03K 19/0005; H03K 19/017545; H03K 19/01825; H03K 19/018557; H03K 19/018528; H03K 19/00315; H03K 19/09432; H03K 17/687; H05K 1/0246; H04L 25/0272; H04L 25/0298; H04L 7/10
See application file for complete search history.

(56) References Cited

U.S. PATENT DOCUMENTS

| 7,750,666 B2 * | 7/2010 | Zhang ............... H03K 19/0005 326/30 |
| 8,410,812 B2 | 4/2013 | Lam et al. |
| 8,441,281 B2 * | 5/2013 | Kothandaraman ........................ H03K 19/09432 326/30 |
| 8,610,463 B2 * | 12/2013 | Yeung ..................... H04B 3/36 326/82 |
| 8,624,625 B2 | 1/2014 | Shin et al. |
| 8,736,306 B2 * | 5/2014 | King ................... H04L 25/0286 326/82 |

(Continued)

*Primary Examiner* — Vibol Tan
(74) *Attorney, Agent, or Firm* — McClure, Qualey & Rodack, LLP

(57) ABSTRACT

A terminal circuit and an output stage circuit are provided. The terminal circuit is configured between a transmitter and an external device. The transmitter provides a differential signal to the external circuit. The terminal circuit includes a first to a third switches and a first and a second resistor. The first switch is biased by a first voltage provided by the transmitter. The first and the second resistor receive the differential signal. The second switch is coupled between the first switch and the first resistor. The third switch is coupled between the first switch and the second resistor. The first to the third switches are controlled by a first to a third control signals, respectively. When the transmitter operates in a power-off mode, a voltage level of the first voltage is in ground level, and the first to the third control signals turn off the first to third switches.

17 Claims, 8 Drawing Sheets

(56) References Cited

U.S. PATENT DOCUMENTS

| | | | |
|---|---|---|---|
| 8,912,819 B2* | 12/2014 | Chen | H03K 19/0005 |
| | | | 326/30 |
| 9,094,245 B2* | 7/2015 | Yeung | H04B 3/36 |
| 9,442,875 B2* | 9/2016 | Chen | G06F 13/4022 |

* cited by examiner

TERMINAL CIRCUIT AND OUTPUT STAGE CIRCUIT HAVING THE SAME

This application claims the benefit of People's Republic of China application Serial No. 201610827204.1, filed Sep. 18, 2016, the subject matter of which is incorporated herein by reference.

BACKGROUND OF THE INVENTION

Field of the Invention

The invention relates in general to a terminal circuit and an output stage circuit having the same.

Description of the Related Art

In the generally known devices (such as a set-top-box or multimedia player) using high definition multimedia interface (HDMI), impedance exists in the signal transmission line between an output stage circuit of the device and an external device. To avoid the transmitted signals being reflected and distorted, suitable impedance matching mechanism is required between the output stage circuit of the device and the external circuit. A conventional terminal circuit is configured between the output stage circuit of the device and the external circuit to provide a terminal resistor to achieve a purpose of impedance matching. However, since a current flows through the transmission line between the output stage circuit of the device and the external circuit, magnetic field will be generated and electromagnetic interference (EMI) will occur. Therefore, it is necessary to provide a terminal circuit, which provides a terminal resistor to achieve impedance matching and decreases the electromagnetic interference generated in the transmission line between the output stage circuit and the external circuit at the same time, so that product quality is increased and less harm is made to human body. Besides, it is also necessary to provide a terminal circuit which can avoid that the current reversely flows to the set-top-box from the TV when the set-top-box is turned off under the situation that the output stage circuit of the set-top-box using HDMI device is connected to the TV. The terminal circuit should also be capable of avoiding that the elements of the output stage circuit of the set-top-box are over-stressed. Wherein, the restriction of the reversely flowing current is specified in the HDMI specification.

SUMMARY OF THE INVENTION

According to one embodiment of the present invention, a terminal circuit is provided. The terminal circuit is configured in a transmitter which receives a differential signal from an external device. The terminal circuit includes a first switch, a first resistor and a second resistor, a second switch and a third switch. A first end of the first switch biased by a first voltage. The first switch is controlled by a first control signal and the first voltage is provided by the transmitter. A first end of the first resistor and a first end of the second resistor receive the differential signal. The second switch is coupled between a second end of the first switch and a second end of the first resistor and controlled by a second control signal. The third switch is coupled between the second end of the first switch and a second end of the second resistor and controlled by a third control signal. When the transmitter operates in a power-off mode, a voltage level of the first voltage is in ground level, and the first control signal, the second control signal and the third control signal are disabled to turn off the first switch, the second switch and the third switch.

According to another of the present invention, an output stage circuit is provided. The output stage circuit includes a first differential-output-end and a second differential-output-end, a terminal circuit, a current source, and a first transistor and a second transistor. The terminal circuit is coupled between the first differential-output-end and the second differential-output-end. The first transistor is coupled between the first differential-output-end and the current source. The second transistor is coupled between the second differential-output-end and the current source. The terminal circuit includes a first switch, a first resistor and a second resistor, a second switch and a third switch. A first end of the first switch is biased by a first voltage. The first switch is controlled by a first control signal. The first voltage is provided by the transmitter. A first end of the first resistor and a first end of the second resistor receive a differential signal. The second switch is coupled between a second end of the first switch and a second end of the first resistor and controlled by a second control signal. The third switch is coupled between the second end of the first switch and a second end of the second resistor and controlled by a third control signal. When the transmitter operates in a power-off mode, a voltage level of the first voltage is in ground level, and the first control signal, and the second control signal and the third control signal are disabled to turn off the first switch, the second switch and the third switch.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
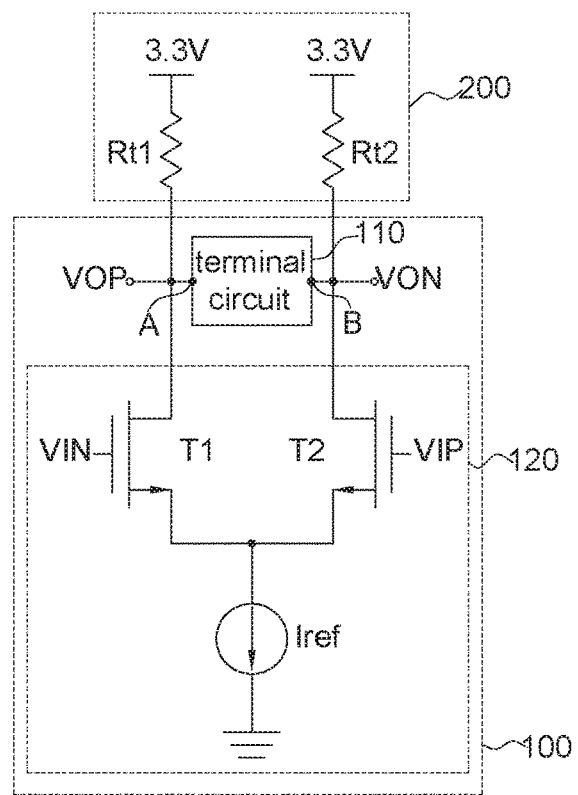
FIG. 1 is a circuit diagram of an output stage circuit according to an embodiment of the disclosure.

FIG. 1 is a circuit diagram of an output stage circuit 100 according to an embodiment of the disclosure. The output stage circuit 100 can be implemented by a circuit conformed to the specifications of high definition multimedia interface (HDMI). The output stage circuit 100 includes a set of differential-output-ends VOP and VON, a terminal circuit 110 and a transmitter 120. The transmitter 120 provides a differential signal to an external circuit 200 via the differential-output-ends VOP and VON. The terminal circuit 110 is configured between the transmitter 120 and the external circuit 200 and coupled between the differential-output-ends VOP and VON. The terminal circuit 110 has an output end A and an output end B, which are coupled to the differential-output-ends VOP and VON respectively. The differential-output-end VOP is used as a positive differential-output-end, and the differential-output-end VON is used as a negative differential-output-end. The signal at the differential-output-end VOP is inputted to the output end A of the terminal circuit 110, and the signal at the differential-output-end VON is inputted to the output end B. In an embodiment, the terminal circuit 110 is, for example, coupled between a TV and an electronic device. The external circuit 200 is, for example, an equivalent circuit of an HDMI input end of a TV. The electronic device mentioned above is, for example, a set-top-box or a multimedia player. The external circuit 200 may include a resistor Rt1 and a resistor Rt2 both biased by a voltage V0. In an embodiment, the resistor Rt1 and the resistor Rt2 both are, for example, 50Ω. The voltage level of the voltage V0 is, for example, 3.3V. The transmitter 120 includes a current source Iref and a pair of transistors T1 and T2, which are respectively coupled between the differential-output-ends VOP and VON and the current source Iref. The control ends of the transistor T1 and the transistor T2 respectively receive signals VIN and VIP to determine the conduction of the transistor T1 and the transistor T2.

Figure 2:
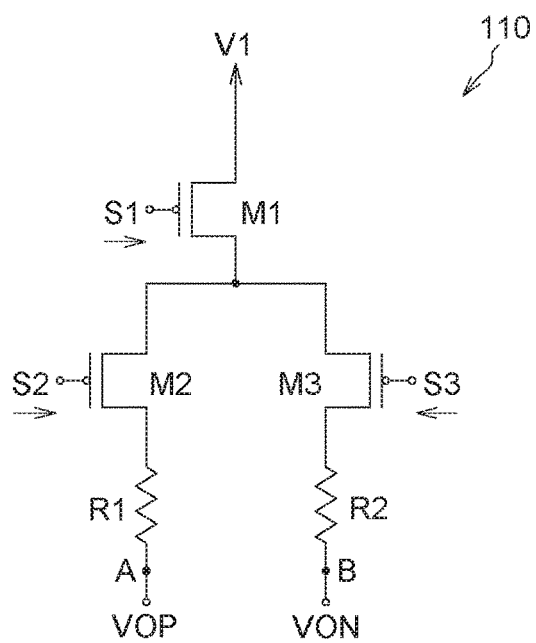
FIG. 2 is a circuit diagram of a terminal circuit according to a first embodiment of the disclosure.

FIG. 2 is a circuit diagram of a terminal circuit 110 according to a first embodiment of the disclosure. In this embodiment, the terminal circuit 110 includes switches M1~M3, and resistive elements R1 and R2. For the convenience of descriptions, the resistive elements R1 and R2 are exemplified by resistors R1 and R2. In this embodiment, each of the switches M1~M3 can be implemented by a P-type Metal-Oxide-Semiconductor Field-Effect Transistor, for example. A first end of the switch M1 (such as the source of the switch M1) is biased by a voltage V1 provided by a transmitter 120, and the switch M1 is controlled by a control signal S1. A first ends of the resistor R1 and R2 receive the differential signals provided through the differential-output-ends VOP and VON respectively. The switch M2 is coupled between a second end of the switch M1 (such as drain of the switch M1) and a second end of the resistor R1 and controlled by a control signal S2. The switch M3 is coupled between the second end of the switch M1 and a second end of the resistor R2 and controlled by a control signal S3. The control signal S2 and the control signal S3 are substantially synchronized and have substantially equivalent voltage level. The voltage levels of the control signals S1~S3 is high enough or low enough to turn on or turn off the switches M1~M3 without making the switches M1~M3 over-stressed. For example, each of the control signals S1~S3 has a high voltage level HV between 2.0V~3.3V and a low voltage level LV between 1.0V~1.5V. The high voltage level HV of the control signals S1~S3 can turn off the switches M1~M3, the low voltage level LV of the control signals S1~3 can turn on the switches M1~M3, and neither the high voltage level HV nor the low voltage level LV will make the switches M1~M3 over-stressed (over-stressed means, for example, the voltage difference between two ends of the switches M1, M2, or M3 is larger than 3.3V). However, the ranges of the high voltage level HV and the low voltage level LV of the control signals S1~S3 aforementioned are taken for example for purpose of illustration only, not for limiting the invention. The ranges of the high voltage level HV and the low voltage level LV of the control signals S1~S3 can be adjusted according to element features (such as breakdown voltage of element) and circuit design. Other voltage range in which the voltage levels of the control signals S1~S3 is high enough or low enough to turn on or turn off the switches M1~M3 without making the switches M1~M3 over-stressed is acceptable for this embodiment.

Figure 3A:
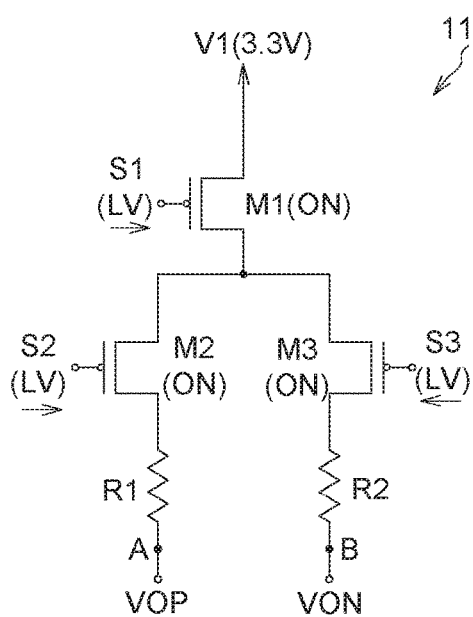
FIG. 3A is a circuit diagram of the terminal circuit of FIG. 2 when the transmitter operates in a normal operation mode.
Figure 3B:
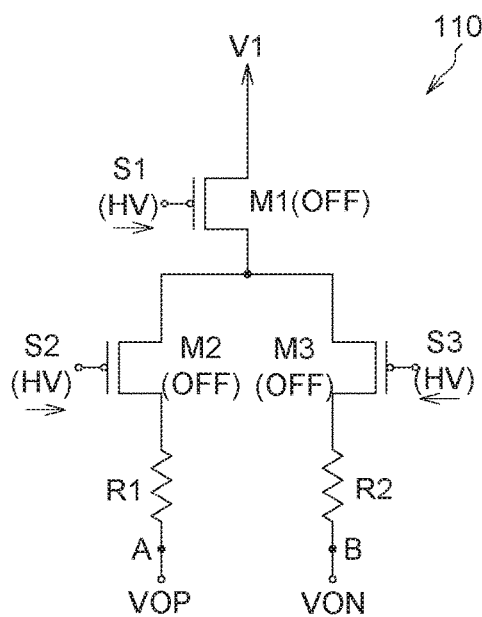
FIG. 3B is a circuit diagram of the terminal circuit of FIG. 2 when the transmitter operates in a power-off mode.
Figure 3C:
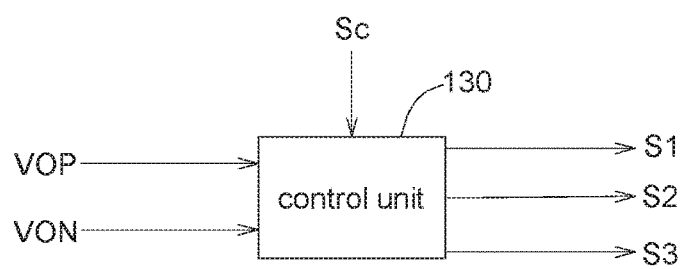
FIG. 3C is a schematic diagram of a control unit of the disclosure.

The embodiment will be described in more detail. Referring to FIG. 3A and FIG. 3B, FIG. 3A is a circuit diagram of the terminal circuit 110 of FIG. 2 when the transmitter 120 operates in a normal operation mode, and FIG. 3B is a circuit diagram of the terminal circuit 110 of FIG. 2 when a transmitter 120 operates in a power-off mode. When the transmitter 120 operates in a normal operation mode (that is, when the output stage circuit 100 is powered normally) as indicated in FIG. 3A, the voltage level of the voltage V1 is 3.3V. In one embodiment, when the control signals S1~S3 are all enabled (having low voltage level LV in this embodiment), the switches M1~M3 are turned on. In this embodiment, the control signals S1~S3 are generated according to the voltage levels at the differential input ends VOP and VON. As shown in FIG. 3C, the control unit 130 generates the control signals S1~S3 according to the voltage levels at the differential input ends VOP and VON and a control signal Sc. The control signal Sc indicates the operation mode of the transmitter 120. For example, when the control signal Sc indicates that the transmitter 120 operates in the normal operation mode, the control unit 130 generates the control signals S1~S3 having an enabling voltage level (LV). Therefore, when the transmitter 120 operates in the normal operation mode, the resistors R1 and R2 are electrically coupled to each other in terminal circuit 110 due to the conduction of switches M2 and M3, and the resistor R1 and R2 are used as terminal resistors between the differential-output-ends VOP and VON. The resistance of the terminal resistor is approximately equivalent to the sum of the resistances of the resistors R1 and R2. In the normal operation mode, the voltage level of the voltage V0 and the voltage level of the voltage V1 can be the same or different. For example, the voltage level of the voltage V0 and the voltage level of the voltage V1 are both 3.3V in the normal operation mode.

On the other hand, when the transmitter 120 operates in a power-off mode (for example, when the device which having the transmitter 120 is power-off), the states of the switches M1~M3 are shown in FIG. 3B. The voltage V1 provided by the transmitter 120 may have two states. In an embodiment, the first state is: when the transmitter 120 is in the state that the power line is plugged off, the voltage V1 will dropped to 0V from 3.3V; the second state is: when the transmitter 120 is in the state that the power line is still plugged in (for example, the transmitter 120 is turned off by using a remote controller or by pressing a power button, but the power line is still plugged in), the voltage V1 can be 3.3V or 0V, depends on the circuit design. The control unit 130 generates the control signals S1~S3 having a disable voltage level (HV) according to the voltage levels of the differential-output-ends VOP and VON and the control signal Sc which indicates that the transmitter 120 operates in a power-off mode. When the control signals S1~S3 are disabled (having a high voltage level HV in this embodiment), the switches M1~M3 are all turned off to avoid the current reversely flows back to the voltage source, which provides the voltage V1, from the differential-output-ends VOP and VON through the switches M2 and M3.

Figure 4A:
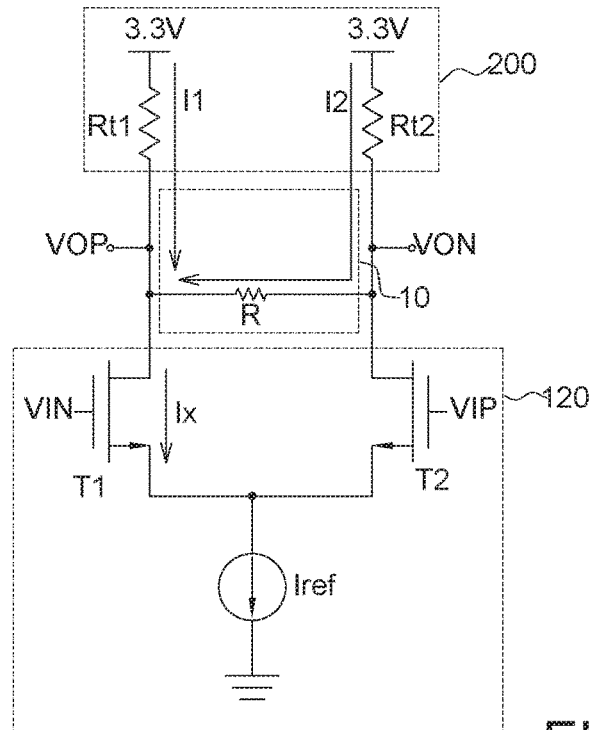
FIG. 4A is an equivalent circuit diagram of a terminal circuit not biased by a voltage provided by the transmitter.

FIG. 4A is an equivalent circuit diagram of a terminal circuit 10 not biased by the voltage V1 provided by the transmitter 120. As shown in FIG. 4A, the terminal circuit 10 is coupled between the transmitter 120 and the external circuit 200 and provides a terminal resistor R between the differential-output-ends VOP and VON to avoid the differential signal transmitted by the external circuit 200 being reflected and distorted. As shown in FIG. 4A, a current I1 flows to the differential-output-end VOP from the resistor Rt1 of the external circuit 200, and another current I2 flows to the differential-output-end VON from the resistor Rt2 of the external circuit 200.

Figure 4B:
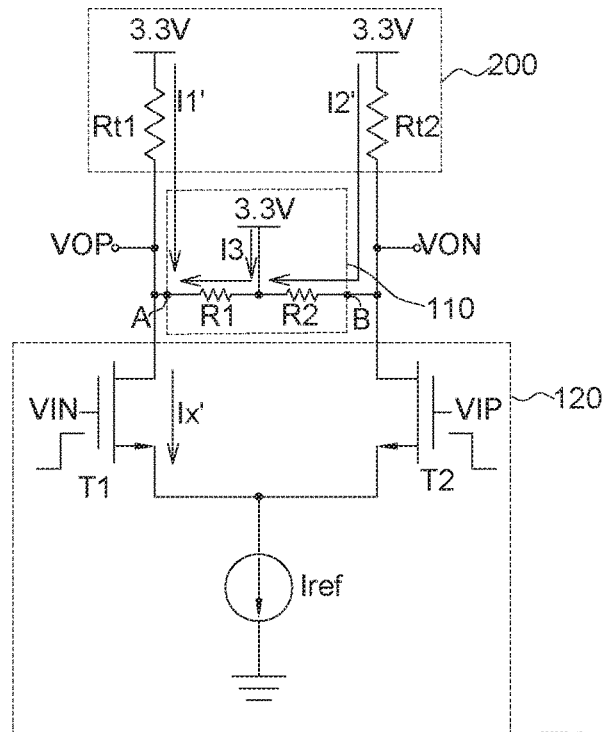
FIG. 4B is an equivalent circuit diagram of a terminal circuit biased by the voltage provided by the transmitter.

FIG. 4B is an equivalent circuit diagram of the terminal circuit 110 biased by the voltage V1 provided by the transmitter 120. The terminal circuit 110 is also coupled between the transmitter 120 and the external circuit 200 and provides a terminal resistor to avoid the differential signal transmitted by the external circuit 200 being reflected and distorted. FIG. 4B is different from FIG. 4A in that the terminal circuit 110 of FIG. 4B provides resistors R1 and R2 connected in series and coupled between the differential-output-ends VOP and VON, and the resistor R1 and R2 are biased by the voltage V1 with 3.3V provided by the transmitter 120. As shown in FIG. 4B, current I1' flows to the differential-output-end VOP from the resistor Rt1 of the external circuit 200, current I2' flows to the differential-output-end VON from the resistor Rt2 of the external circuit 200, and current I3 flows to the resistor R1 from the voltage source which provides the voltage V1 having a voltage level of 3.3V. Wherein, in this embodiment, the voltage level of the signal VIN is inverse to the signal VIP. That is, when the signal VIN has a high voltage level, the signal VIP has a low voltage level. Conversely, when signal VIN has a low voltage level, the signal VIP has a high voltage level.

Refer to FIG. 4A and FIG. 4B. As shown in FIG. 4A, the currents I1 and I2 flow to the differential-output-ends VOP and VON from the external circuit 200, therefore, the current Ix flows through the transistor T1 is equal to the summation of I1 and I2 (Ix=I1+I2). In comparison, as shown in FIG. 4B, due to the terminal circuit 110 in this embodiment is biased by voltage V1 with 3.3V, thus the current I3 is further provided to the resistor R1. Therefore, the current Ix' flow through the transistor T1 is equal to the summation of I1', I2' and I3 (Ix'=I1 +I2'+I3). Given that Ix is equivalent to Ix', that is, I1+I2 is equivalent to I1'+I2'+I3. It can be obtained that I1'+I2'<I1+I2. That said, since the terminal circuit 110 is biased by the voltage V1 with 3.3V and the current I3 flows through the resistor R1, the current I1'+I2' flowing to the differential-output-ends VOP and VON from the resistors Rt1 and Rt2 of the external circuit 200 is smaller than the current I1+I2 corresponding to the terminal circuit 110 not biased by the voltage V1 provided by the transmitter 120. Because the terminal circuit 110 of FIG. 4B makes the current I1' flow through the transmission line between the external circuit 200 and the output stage circuit 100 smaller than the current I1, thus, the electromagnetic interference (EMI) occurring in the transmission line between the external circuit 200 and the output stage circuit 100 of the disclosure can be decreased accordingly.

Figure 5:
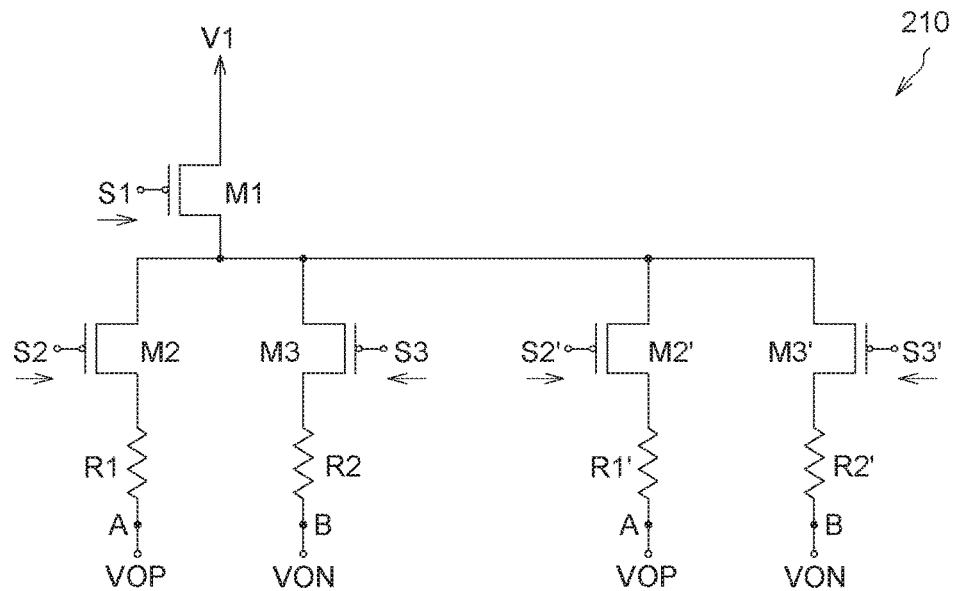
FIG. 5 is a circuit diagram of a terminal circuit according to a second embodiment of the disclosure.

FIG. 5 is a circuit diagram of a terminal circuit 210 according to a second embodiment of the disclosure. Comparing to the terminal circuit 110 aforementioned, the terminal circuit 210 further includes resistors R1' and R2', and switches M2' and M3'. The switch M2' and the resistor R1' are connected in series between a second end of the switch M1 and the differential-output-end VOP. The switch M3' and the resistor R2' are connected in series between the second end of the switch M1 and the differential-output-end VON. The switches M2 and M3 and the resistors R1 and R2 are connected in parallel with the switches M2' and M3' and the resistors R1' and R2'. In this embodiment, both switches M2' and M3' can be implemented by a P-type Metal-Oxide-Semiconductor Field-Effect Transistor. A first ends of the resistor R1' and R2' receive the differential signals from the differential-output-ends VOP and VON. The switch M2' is coupled between a second end of the switch M1 and a second end of the resistor R1' and controlled by a control signal S2'. The switch M3' is coupled between a second end of the switch M1' and a second end of the resistor R2' and controlled by a control signal S3'. In this embodiment, the control signals S1, S2, S3, S2', and S3' are generated by a control unit according to the voltage levels of the differential input ends VOP and VON and a control signal Sc. In this embodiment, the control signal Sc can be set according to user's requirement, to instruct the control unit to generate the control signals S1~S3 and the control signals S2' and S3' having an enabling or a disable voltage level to determine the conduction of the switches M1~M3 and the switches M2' and M3'.

Figure 6A:
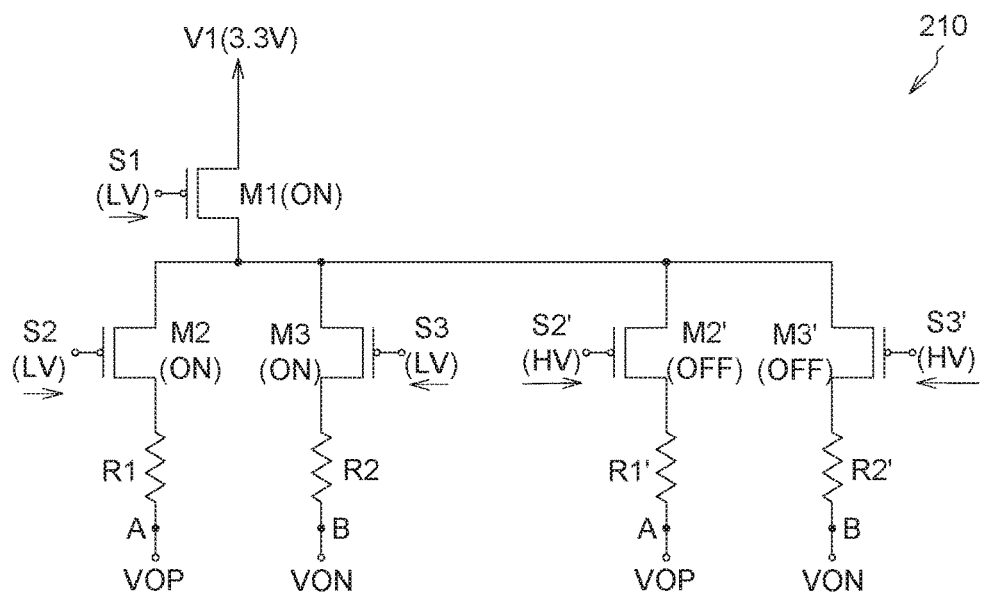
FIG. 6A and FIG. 6B show the terminal circuit of FIG. 5 having two different impedance values when the transmitter operates in a normal operation mode.
Figure 6B:
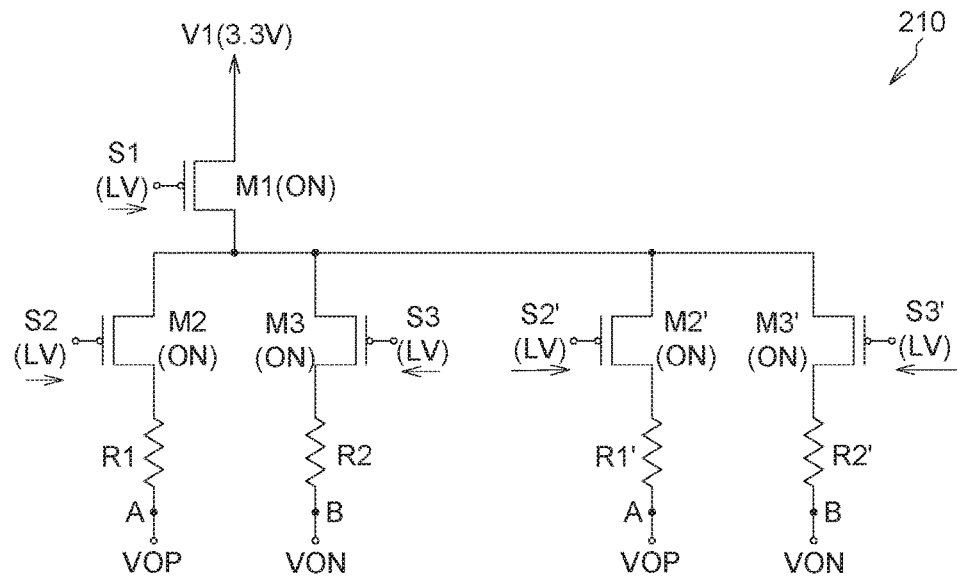

To describe in more detail, when the transmitter 120 operates in a normal operation mode, the terminal circuit 210 shown in FIG. 5 can selectively turn on or turn off the switches to select different impedance values. Referring to FIGS. 6A and 6B, FIG. 6A and FIG. 6B show the terminal circuit 210 of FIG. 5 having two different impedance values when the transmitter 120 operates in a normal operation mode. As shown in FIG. 6A, when the transmitter 120 operates in a normal operation mode, and the voltage level of the voltage V1 is 3.3V. When the control signals S1~S3 are enabled (In this embodiment, when the voltage level of the control signals S1~S3 is LV), the switches M1~M3 are turned on, so that the resistors R1 and R2 are coupled to each other and the resistors R1 and R2 are used as terminal resistors between the differential-output-ends VOP and VON. As shown in FIG. 6A, when the control signal S2' and the control signal S3' are disabled (In this embodiment, when the voltage level of the control signals S1~S3 is a high voltage level HV), the switches M2' and M3' are turned off, so that the resistors R1' and R2' are not coupled to each other and are not used as terminal resistors between the differential-output-ends VOP and VON. That is, in FIG. 6A, since the switches M1~M3 are turned on and the switches M2' and M3' are turned off, the terminal circuit 210 uses the coupled resistors R1 and R2 as terminal resistors between the differential-output-ends VOP and VON. However, the invention is not limited thereto. In another embodiment, since the switch M1, the switches M2' and M3' are turned on and the switches M2 and M3 are turned off, the coupled resistors R1' and R2' are used as terminal resistors between the differential-output-ends VOP and VON.

In FIG. 6B, the terminal circuit 210 further provides an impedance value different from that of the terminal circuit 210 of FIG. 6A. As shown in FIG. 6B, when the control signal S2, the control signal S3, the control signal S2' and the control signal S3' all are enabled (LV), which conduct the switches M2 and M3 and the switches M2' and M3'. Therefore, in FIG. 6B, since the switches M1~M3 and M2' and M3' are all turned on, the coupled resistors R1 and R2 of the terminal circuit 210 are connected in parallel with the coupled resistors R1' and R2' and used as the terminal resistors between the differential-output-ends VOP and VON. That is, the terminal circuit 210 of FIG. 5 can selectively turn on or turn off the switches to select the terminal resistors with different impedance values. For example, the coupled resistors R1 and R2 can be selected as the terminal resistors between the differential-output-ends VOP and VON. Or, the coupled resistors R1' and R2' are selected as terminal resistors between the differential-output-ends VOP and VON. Or, the coupled resistors R1 and R2 are connected in parallel with the coupled resistors R1' and R2' and then coupled resistors R1, R2, R1', and R2' are used as terminal resistors between the differential-output-ends VOP and VON. However, the invention is not limited thereto. More switches and resistors can be configured between the second end of the switch M1 and the differential-output-end VOP or VON to adjust the impedance value of the terminal resistor of the terminal circuit.

Figure 7:
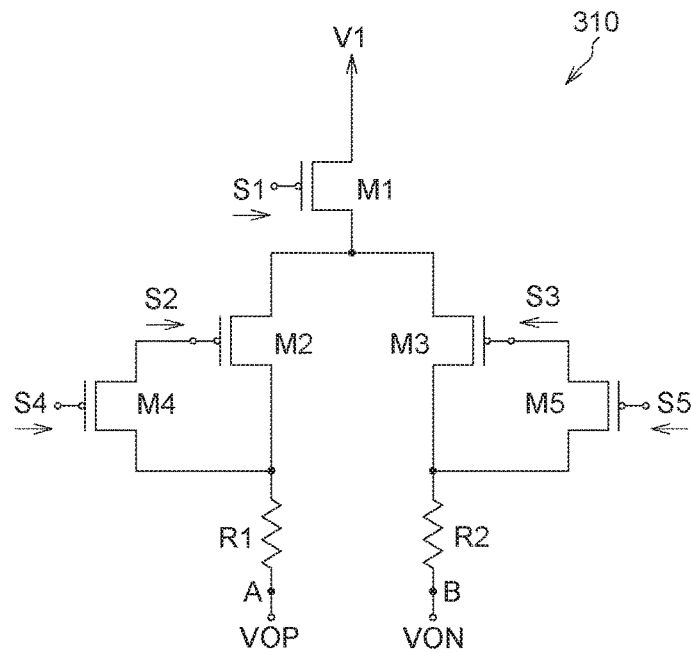
FIG. 7 is a circuit diagram of a terminal circuit according to a third embodiment of the disclosure.

FIG. 7 is a circuit diagram of a terminal circuit 310 according to a third embodiment of the disclosure. In this embodiment, the terminal circuit 310 is different from the terminal circuit 110 of FIG. 2 in that the terminal circuit 310 further includes switches M4 and M5. The switch M4 is coupled between a control end of the switch M2 and a second end of the resistor R1. The switch M4 is controlled by a control signal S4 and provides a control signal S2 to the control end of the switch M2. The switch M5 is coupled between a control end of the switch M3 and a second end of the resistor R2. The switch M5 is controlled by a control signal S5 and provides a control signal S3 to the control end of the switch M3. In this embodiment, both switches M4 and M5 can be implemented by a P-type Metal-Oxide-Semiconductor Field-Effect Transistor; the source of the switch M4 is coupled to the control end of the switch M2; the source of the switch M5 is coupled to the control end of the switch M3. In this embodiment, the control signal S1, S4 and S5 are generated by a control unit according to the voltage levels at the differential input ends VOP and VON and a control signal Sc. The control signal S2 and the control signal S3 are generated according to the conduction status of the switches M4 and M5 respectively. In this embodiment, the control signal Sc can be set according to user's requirement to instruct the control unit to generate the control signal S1, S4 and S5 having an enabling or a disable voltage level to turn on or turn off the switches M1, M4 and M5, and further turn on or turn off the switch M2 and M3 according to the conduction status of the switches M4 and M5. Similar to the control signals S1~S3, the ranges of the high voltage level HV and the low voltage level LV of the control signals S4 and S5 can be adjusted according to element features (such as the breakdown voltage of element) and circuit design, as long as the voltage levels of the control signals S4 and S5 is high or low enough to turn on or turn off the switches M4 and M5 without making the switches M4 and M5 overstressed.

Figure 8A:
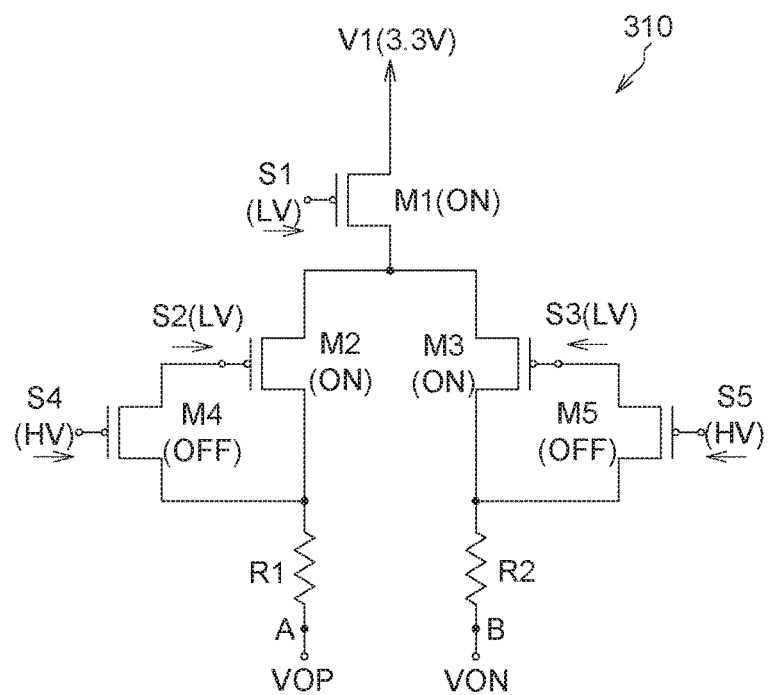
FIGS. 8A and 8B show the terminal circuit of FIG. 7 when the transmitter operates in a normal operation mode and a power-off mode, respectively.
Figure 8B:
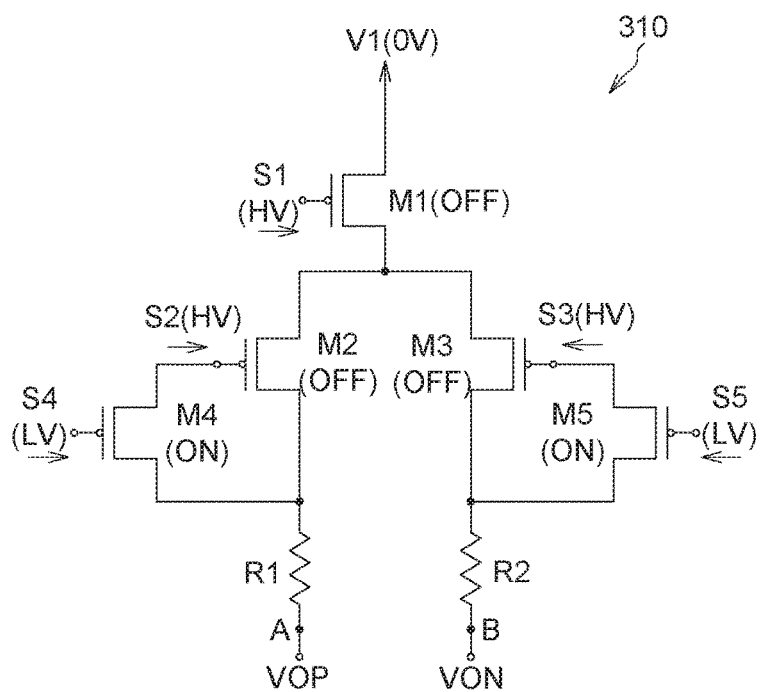

Referring to FIGS. 8A and 8B, FIGS. 8A and 8B shows the terminal circuit 310 of FIG. 7 when the transmitter 120 operates in a normal operation mode and a power-off mode, respectively. As shown in FIG. 8A, when the transmitter 120 operates in a normal operation mode, the control signal S1 is enabled (LV), the voltage level of the voltage V1 is 3.3V, and the switch M1 is turned on. The control signal S4 is disabled (HV), so that the switch M4 is turned off and provides the control signal S2 having an enabling voltage level (LV) to the control end of the switch M2 to turn on the switch M2. Similarly, the control signal S5 is disabled (HV), so that the switch M5 is turned off and provides the control signal S3 having an enabling voltage level (LV) to the control end of the switch M3 to turn on the switch M3. Therefore, when the transmitter 120 operates in a normal operation mode, the terminal circuit 310 will turn on the switches M2 and M3 by turning off the switches M4 and M5, so that the resistors R1 and R2 are coupled to each other and used as terminal resistors between the differential-output-ends VOP and VON.

On the other hand, when the transmitter 120 operates in a power-off mode, as shown in FIG. 8B, the voltage level of the voltage V1 provided by the transmitter 120 changes to a ground level (e.g. 0V) from 3.3V, the control signal S1 is disabled (having a high voltage level HV), and the switch M1 thus turned off. The control signal S4 is enabled (having a low voltage level LV), so that the switch M4 is turned on and provides the control signal S2 having a high voltage level (HV) to the control end of the switch M2 to turn off the switch M2. Similarly, the control signal S5 is enabled (has a low voltage level LV), so that the switch M5 is turned on and provides the control signal S3 having a disable voltage level (HV) to the control end of the switch M3 to turn off the switch M3. Therefore, when the transmitter 120 operates in a power-off mode, the terminal circuit 310 turns off the switches M2 and M3 by turning on the switches M4 and M5 to avoid the current reversely flowing to the voltage source which providing the voltage V1 from the differential-output-ends VOP and VON through the switches M2 and M3.

Figure 9:
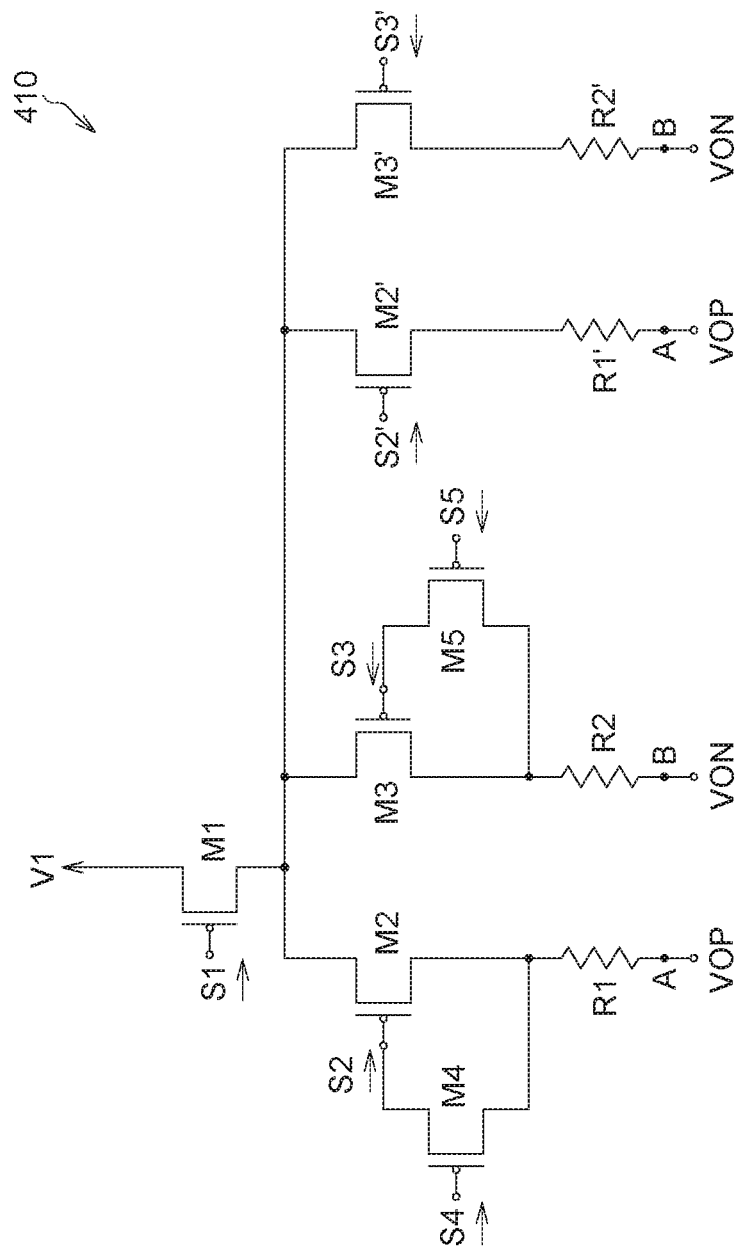
FIG. 9 is a circuit diagram of a terminal circuit according to a fourth embodiment of the disclosure.

FIG. 9 is a circuit diagram of a terminal circuit 410 according to a fourth embodiment of the disclosure. In this embodiment, the terminal circuit 410 is different from the terminal circuit 310 of FIG. 7 in that the terminal circuit 410 further includes a resistor R1' and a resistor R2', and a switch M2' and a switch M3'. The coupling way of the resistors R1' and R2' and the switches M2' and M3' of FIG. 9 is the same as the structure shown in FIG. 5, and the similarities are not repeated here. Like the terminal circuit 210 of FIG. 5, the terminal circuit 410 of FIG. 9 can selectively turn on or turn off the switches to select a different set of resistors (for example, coupled resistors R1 and R2 or coupled resistors R1' and R2') as terminal resistors between the differential-output-ends VOP and VON. Or, the coupled resistors R1 and R2 and the coupled resistors R1' and R2' are connected in parallel and then are used as terminal resistors between the differential-output-ends VOP and VON.

Figure 10:
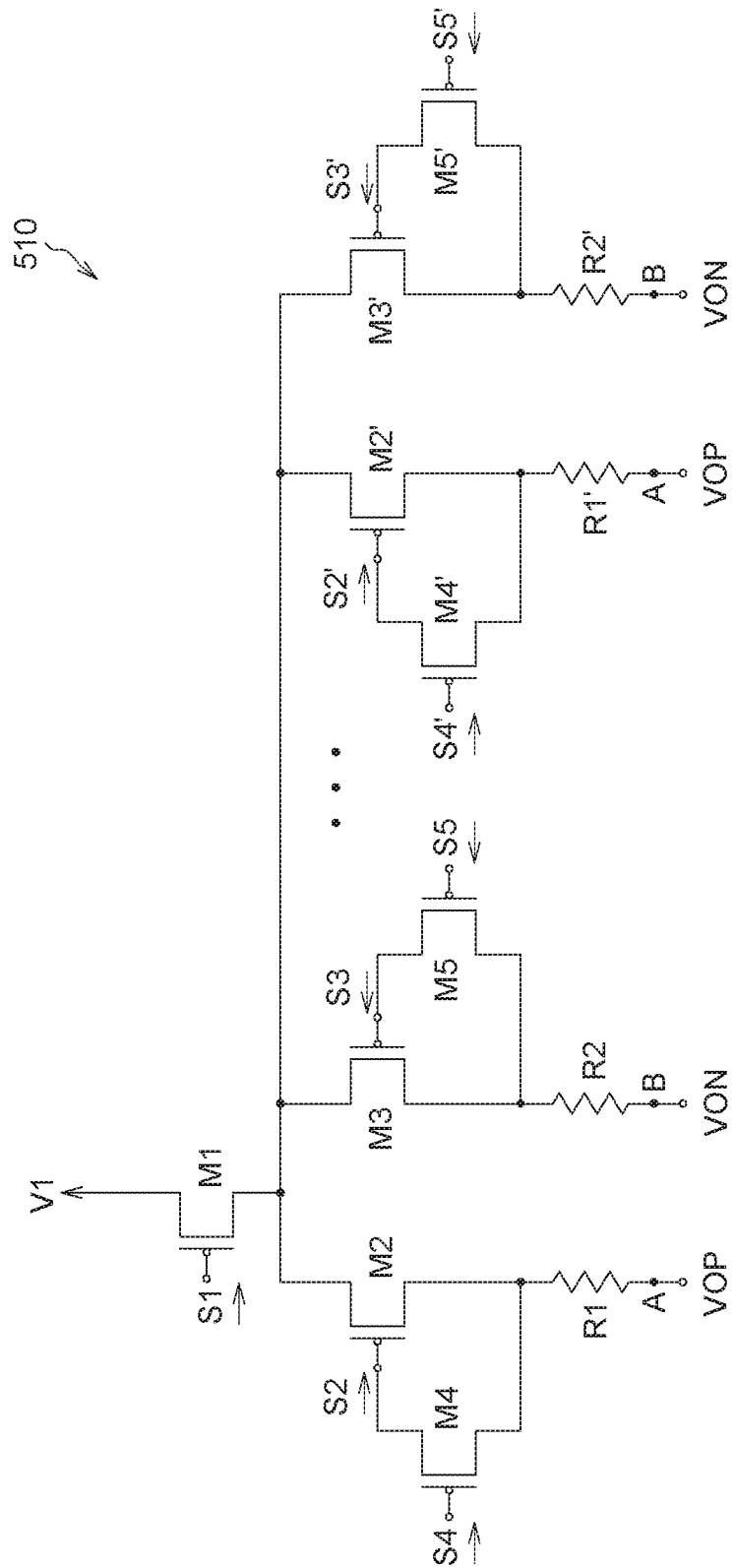
FIG. 10 is a circuit diagram of a terminal circuit according to a fifth embodiment of the disclosure.

FIG. 10 is a circuit diagram of a terminal circuit 510 according to a fifth embodiment of the disclosure. The terminal circuit 510 is different from the terminal circuit 410 of FIG. 9 in that the terminal circuit 510 further includes switches M4' and switch M5', similar to the terminal circuit 310 of FIG. 7. The switch M4' is coupled between a control end of the switch M2' and a second end of the resistor R1'. The switch M4' is controlled by a control signal S4' and provides a control signal S2' to the control end of the switch M2'. The switch M5' is coupled between a control end of the switch M3' and a second end of the resistor R2'. The switch M5' is controlled by a control signal S5' and provides a control signal S3' to the control end of the switch M3'. Similarly, the terminal circuit 510 of FIG. 10 can selectively turn on or turn off the switches to select a different resistor set (coupled resistors R1 and R2 or coupled resistors R1' and R2') as terminal resistors between the differential-output-ends VOP and VON. Or, the coupled resistors R1 and R2 and the coupled resistors R1' and R2' are connected in parallel and then are used as terminal resistors between the differential-output-ends VOP and VON. The switches M2∫M5 can be regarded as the first set of switches. The switches M2'~M5' can be regarded as the second set of switches. In other embodiments of the disclosure, the terminal circuit 510 can further includes other sets of switches, such as a third set of switches, a fourth set of switches . . . and an $N^{th}$ set of switches similar to the first set of switches or the second set of switches, wherein N is a positive integer greater than 2.

According to the embodiments disclosed above, the disclosure provides several types of terminal circuits and output stage circuits. The terminal circuit is biased by a voltage V1 provided by the transmitter 120 to reduce the current of the external circuit 200 and decrease the electromagnetic interference occurring in the transmission line between the external circuit 200 and the transmitter 120, so that product quality is increased and less harm is made to human body. Meanwhile, when the transmitter 120 operates in a power-off mode, the switches M1~M3 can be turned off to avoid the current reversely flowing to the voltage source of voltage V1 from the differential-output-ends VOP and VON through the switches M2 and M3 and avoid the transmitter 120 generating erroneous actions or being damaged.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A terminal circuit configured between a transmitter and an external circuit, wherein the transmitter provides a differential signal to the external circuit, and the terminal circuit comprises:
    a first switch, wherein a first end of the first switch is biased by a first voltage, the first switch is controlled by a first control signal and the first voltage is provided by the transmitter;
    a first resistor and a second resistor, wherein a first end of the first resistor and a first end of the second resistor receive the differential signal;
    a second switch coupled between a second end of the first switch and a second end of the first resistor and controlled by a second control signal; and
    a third switch coupled between the second end of the first switch and a second end of the second resistor and controlled by a third control signal;
    wherein when the transmitter operates in a power-off mode, a voltage level of the first voltage is in ground level, and the first control signal, the second control signal and the third control signal are disabled to turn off the first switch, the second switch and the third switch.

2. The terminal circuit according to claim 1, wherein when the transmitter operates in a normal operation mode and the first control signal, the second control signal, and the third control signal are enabled, the voltage level of the first voltage is in a first voltage level, and the first switch, the second switch and the third switch are turned on;
    and wherein when the transmitter operates in the normal operation mode and the first control signal is enabled but the second control signal and the third control signal are disabled, the voltage level of the first voltage is in the first voltage level, the first switch is turned on, and the second switch and the third switch are turned off.

3. The terminal circuit according to claim 1, wherein each of the first switch, the second switch, and the third switch is implemented by a P-type Metal-Oxide-Semiconductor Field-Effect Transistor.

4. The terminal circuit according to claim 1, further comprising:
    a fourth switch coupled between a control end of the second switch and the second end of the first resistor and controlled by a fourth control signal, wherein the fourth switch provides the second control signal to the control end of the second switch; and
    a fifth switch coupled between a control end of the third switch and the second end of the second resistor and controlled by a fifth control signal, wherein the fifth switch provides the third control signal to the control end of the third switch;
    wherein when the transmitter operates in the power-off mode, the fourth control signal and the fifth control signal are enabled to turn on the fourth switch and the fifth switch and disable the second control signal and the third control signal to turn off the second switch and the third switch.

5. The terminal circuit according to claim 4, wherein both the fourth switch and the fifth switch are implemented by P-type Metal-Oxide-Semiconductor Field-Effect Transistor, a source of the fourth switch is coupled to the control end of the second switch, and a source of the fifth switch is coupled to the control end of the third switch.

6. The terminal circuit according to claim 1, further comprising:
    a third resistor and a fourth resistor, wherein a first end of the third resistor and a first end of the fourth resistor receive the differential signal;
    a sixth switch coupled between the second end of the first switch and a second end of the third resistor and controlled by a sixth control signal; and
    a seventh switch coupled between the second end of the first switch and a second end of the fourth resistor and controlled by a seventh control signal;
    wherein when the transmitter operates in the normal operation mode and the first control signal, the sixth control signal, and the seventh control signal are enabled, the voltage level of the first voltage is in a first voltage level, and the first switch, the sixth switch and the seventh switch are turned on;
    wherein when the transmitter operates in the power-off mode, the sixth control signal and the seventh control signal are disabled to turn off the sixth switch and the seventh switch.

7. The terminal circuit according to claim 6, wherein when the transmitter operates in the normal operation mode and the sixth control signal and the seventh control signal are enabled, the sixth switch and the seventh switch are turned on;
    and wherein when the transmitter operates in the normal operation mode and the sixth control signal and the seventh control signal are disabled, the sixth switch and the seventh switch are turned off.

8. The terminal circuit according to claim 6, further comprising:
    an eighth switch coupled between a control end of the sixth switch and the second end of the third resistor and controlled by a eighth control signal, wherein the eighth switch provides the sixth control signal to the control end of the sixth switch; and
a ninth switch coupled between a control end of the seventh switch and the second end of the fourth resistor and controlled by a ninth control signal, wherein the ninth switch provides the seventh control signal to the control end of the seventh switch;
wherein when the transmitter operates in the power-off mode, the eighth control signal and the ninth control signal are enabled to turn on the eighth switch and disabled the sixth control signal and the seventh control signal to turn off the sixth switch and the seventh switch.

9. The terminal circuit according to claim 7, wherein both the eighth switch and the ninth switch are implemented by a P-type Metal-Oxide-Semiconductor Field-Effect Transistor, a source of the eighth switch is coupled to the control end of the sixth switch, and a source of the ninth switch is coupled to the control end of the seventh switch.

10. An output stage circuit, comprising:
a first differential-output-end and a second differential-output-end;
the terminal circuit according to claim 1, wherein the terminal circuit is coupled between the first differential-output-end and the second differential-output-end;
a current source; and
a first transistor and a second transistor, wherein the first transistor is coupled between the first differential-output-end and the current source, and the second transistor is coupled between the second differential-output-end and the current source.

11. The output stage circuit according to claim 10, wherein the first differential-output-end and the second differential-output-end is adapted to provide the differential signal to the external circuit, the external circuit comprises a fifth resistor and a sixth resistor both biased by a second voltage.

12. The terminal circuit according to claim 10, wherein when the transmitter operates in a normal operation mode and the first control signal, the second control signal, and the third control signal are enabled, a voltage level of the first voltage is in ground level, and the first switch, the second switch and the third switch are turned on;
and wherein when the transmitter operates in the normal operation mode and the first control signal is enabled but the second control signal and the third control signal are disabled, the voltage level of the first voltage is in the first voltage level, the first switch is turned on, and the second switch and the third switch are turned off.

13. The terminal circuit according to claim 10, wherein each of the first switch, the second switch, and the third switch is implemented by a P-type Metal-Oxide-Semiconductor Field-Effect Transistor.

14. The terminal circuit according to claim 10, further comprising:
a fourth switch coupled between a control end of the second switch and the second end of the first resistor and controlled by a fourth control signal, wherein the fourth switch provides the second control signal to the control end of the second switch; and
a fifth switch coupled between a control end of the third switch and the second end of the second resistor and controlled by a fifth control signal, wherein the fifth switch provides the third control signal to the control end of the third switch;
wherein when the transmitter operates in the power-off mode, the fourth control signal and the fifth control signal are enabled to turn on the fourth switch and the fifth switch and disable the second control signal and the third control signal to turn off the second switch and the third switch.

15. The terminal circuit according to claim 14, wherein both the fourth switch and the fifth switch are implemented by P-type Metal-Oxide-Semiconductor Field-Effect Transistor, a source of the fourth switch is coupled to the control end of the second switch, and a source of the fifth switch is coupled to the control end of the third switch.

16. The terminal circuit according to claim 10, further comprising:
a third resistor and a fourth resistor, wherein a first end of the third resistor and a first end of the fourth resistor receive the differential signal;
a sixth switch coupled between the second end of the first switch and a second end of the third resistor and controlled by a sixth control signal; and
a seventh switch coupled between the second end of the first switch and a second end of the fourth resistor and controlled by a seventh control signal;
wherein when the transmitter operates in the normal operation mode and the first control signal, the sixth control signal, and the seventh control signal are enabled, the voltage level of the first voltage is in a first voltage level, and the first switch, the sixth switch and the seventh switch are turned on;
wherein when the transmitter operates in the power-off mode, the sixth control signal and the seventh control signal are disabled to turn off the sixth switch and the seventh switch.

17. The terminal circuit according to claim 16, wherein when the transmitter operates in the normal operation mode and the sixth control signal and the seventh control signal are enabled, the sixth switch and the seventh switch are turned on;
and wherein when the transmitter operates in the normal operation mode and the sixth control signal and the seventh control signal are disabled, the sixth switch and the seventh switch are turned off.

* * * * *